(12) United States Patent
Kim et al.

(10) Patent No.: US 12,555,757 B2
(45) Date of Patent: Feb. 17, 2026

(54) SEMICONDUCTOR EQUIPMENT MONITORING APPARATUS, AND SEMICONDUCTOR EQUIPMENT INCLUDING THE SEMICONDUCTOR EQUIPMENT MONITORING APPARATUS

(71) Applicant: SAMSUNG ELECTRONICS CO., LTD., Suwon-si (KR)

(72) Inventors: Taekjin Kim, Suwon-si (KR); Meehyun Lim, Suwon-si (KR); Sungyeol Kim, Suwon-si (KR); Junbum Park, Suwon-si (KR); Sungyoung Yoon, Suwon-si (KR); Jinyeong Yun, Suwon-si (KR); Jungchul Lee, Suwon-si (KR); Sungyong Lim, Suwon-si (KR); Sunghwi Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 406 days.

(21) Appl. No.: 18/124,954

(22) Filed: Mar. 22, 2023

(65) Prior Publication Data

US 2024/0055243 A1    Feb. 15, 2024

(30) Foreign Application Priority Data

Aug. 12, 2022    (KR) .......................... 10-2022-0101589

(51) Int. Cl.
*H01J 37/32*    (2006.01)
*H01L 21/67*    (2006.01)
*H01L 21/683*    (2006.01)

(52) U.S. Cl.
CPC .. *H01J 37/32972* (2013.01); *H01L 21/67069* (2013.01); *H01L 21/67253* (2013.01); *H01L 21/6833* (2013.01); *H01J 2237/24495* (2013.01)

(58) Field of Classification Search
CPC ......... H01L 21/67069; H01L 21/67253; H01L 21/6833; H01J 2237/244495; H01J 37/32972
See application file for complete search history.

(56) References Cited

U.S. PATENT DOCUMENTS 6,468,816 B2    10/2002    Hunter
7,520,956 B2 *  4/2009    Samukawa ............. H01L 22/34
                                                156/345.24

(Continued)

FOREIGN PATENT DOCUMENTS

JP    2003-282546    10/2003
KR    10-2018-0073700 A    7/2018
KR    10-1916702 B1    11/2018

OTHER PUBLICATIONS

Communication dated Jan. 12, 2026 issued by the Korean Intellectual Property Office in counterpart Korean Application No. 10-2022-010589.

*Primary Examiner* — Kevin K Pyo
(74) *Attorney, Agent, or Firm* — Sughrue Mion, PLLC

(57) ABSTRACT

A semiconductor equipment monitoring apparatus including a wafer-type sensor inside a process chamber and configured to sense a plasma state inside the process chamber; a light detector and analyzer configured to detect and analyze light sensed by the wafer-type sensor; and a light coupler between the wafer-type sensor and the light detector and analyzer and configured to transmit the light sensed by the wafer-type (Continued)

sensor to the light detector and analyzer. The wafer-type sensor includes a plurality of sensors each comprising a passive element.

17 Claims, 11 Drawing Sheets

(56) References Cited

U.S. PATENT DOCUMENTS

| | | |
|---|---|---|
| 7,960,670 B2 | 6/2011 | Mundt et al. |
| 10,692,705 B2 | 6/2020 | Mihaylov et al. |
| 10,720,350 B2 | 7/2020 | Nguyen et al. |
| 2005/0011611 A1 | 1/2005 | Mahoney et al. |
| 2005/0115673 A1 | 6/2005 | Samukawa et al. |
| 2005/0284570 A1 | 12/2005 | Doran et al. |
| 2006/0043063 A1 | 3/2006 | Mahoney et al. |
| 2015/0020972 A1 | 1/2015 | Jensen et al. |
| 2023/0207294 A1* | 6/2023 | Jin .................... H01J 37/32541 156/345.28 |

* cited by examiner

SEMICONDUCTOR EQUIPMENT MONITORING APPARATUS, AND SEMICONDUCTOR EQUIPMENT INCLUDING THE SEMICONDUCTOR EQUIPMENT MONITORING APPARATUS

CROSS-REFERENCE TO RELATED APPLICATION

This application is based on and claims priority to Korean Patent Application No. 10-2022-0101589, filed on Aug. 12, 2022, in the Korean Intellectual Property Office, the disclosure of which is incorporated by reference herein in its entirety.

BACKGROUND

The present disclosure relates to a semiconductor equipment monitoring apparatus, and more particularly, to a semiconductor equipment monitoring apparatus which may monitor semiconductor equipment in-situ, and semiconductor equipment including the semiconductor equipment monitoring apparatus.

A plasma process is widely used in manufacturing semiconductors, flat panel display devices, solar cells, or the like. To secure the reliability of a plasma process, a technique for monitoring plasma process conditions or process reproducibility is required. An electron density is directly related to a radical density. The electron density or radical density is closely related to the speed of a deposition or an etching process. A tool capable of measuring the electron density may include a Langmuir probe, a Laser Thomson scattering device, or the like. Such measuring tools are very limited for use in plasma processes. For example, in the case of a Langmuir probe, noise caused by a radio frequency (RF) power source for plasma generation, deposition on the probe during thin film deposition, the size of the probe being reduced by etching, or the like may occur. In the case of the Laser Thomson scattering device, the system may be large and complex.

SUMMARY

The disclosure provides a semiconductor equipment monitoring apparatus capable of being used in an actual plasma process condition and accurately analyzing a plasma state in a process chamber, and semiconductor equipment including the semiconductor equipment monitoring apparatus.

According to an aspect of an embodiment, a semiconductor equipment monitoring apparatus includes: a wafer-type sensor inside a process chamber and configured to sense a plasma state inside the process chamber; a light detector and analyzer configured to detect and analyze light sensed by the wafer-type sensor; and a light coupler between the wafer-type sensor and the light detector and analyzer and configured to transmit the light sensed by the wafer-type sensor to the light detector and analyzer, wherein the wafer-type sensor comprises a plurality of sensors each comprising a passive element.

According to an aspect of an embodiment, a semiconductor equipment monitoring apparatus includes: a wafer-type sensor comprising a body having a wafer shape, a plurality of sensors at different positions on an upper surface of the body, and a plurality of waveguides inside the body and respectively connected to the plurality of sensors; and a light coupler between the wafer-type sensor and a light detector, the light coupler comprising a first light transmission device in an electro-static chuck (ESC) of a process chamber and a second light transmission device inside the body of the wafer-type sensor, wherein each of the plurality of sensors comprises a passive element, and wherein the wafer-type sensor is inside the process chamber and configured to sense a plasma state inside the process chamber.

According to an aspect of an embodiment, a semiconductor equipment includes: a process chamber configured to perform a semiconductor operation using plasma; and a semiconductor equipment monitoring apparatus comprising components inside the process chamber and configured to monitor a plasma state of the inside of the process chamber, wherein the semiconductor equipment monitoring apparatus comprises: a wafer-type sensor inside the process chamber and configured to sense a plasma state inside the process chamber; a light detector and analyzer configured to detect and analyze light sensed by the wafer-type sensor; and a light coupler between the wafer-type sensor and the light detector and analyzer and configured to transmit the light sensed by the wafer-type sensor to the light detector and analyzer, wherein the wafer-type sensor comprises a plurality of sensors each comprising a passive element.

BRIEF DESCRIPTION OF DRAWINGS

The above and other aspects and features will be more apparent from the following description of embodiments, taken in conjunction with the accompanying drawings, in which.

DETAILED DESCRIPTION OF EMBODIMENTS

Figure 1:
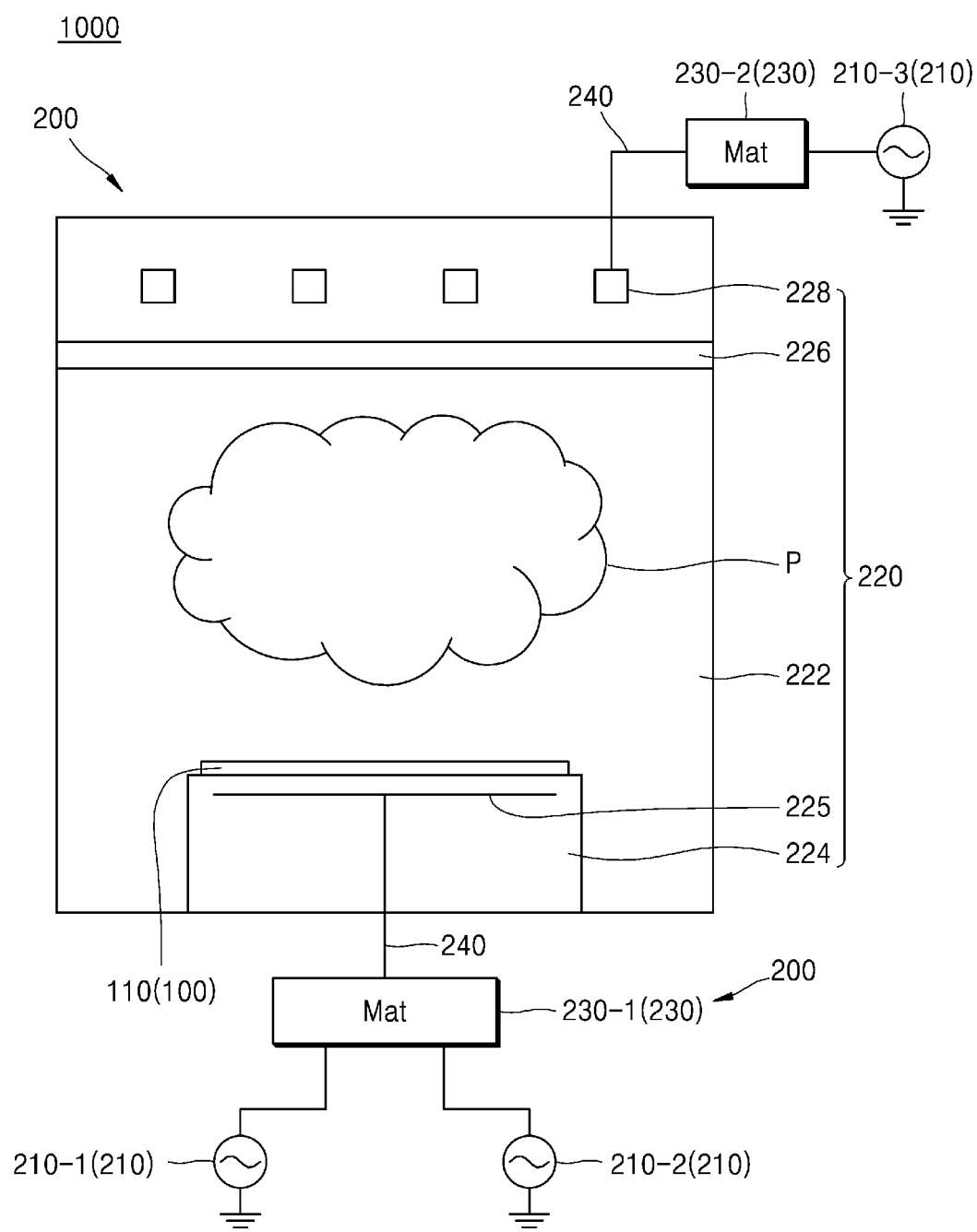
FIG. 1 is a conceptual diagram of semiconductor equipment including a semiconductor equipment monitoring apparatus according to an embodiment.

Example embodiments will be described more fully with reference to the accompanying drawings, in which example embodiments are shown. Embodiments described herein are provided as example embodiments, and thus, the present disclosure is not limited thereto, and may be realized in various other forms. Each embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Like reference numerals in the drawings denote like elements, and thus their description will be omitted.

Figure 2:
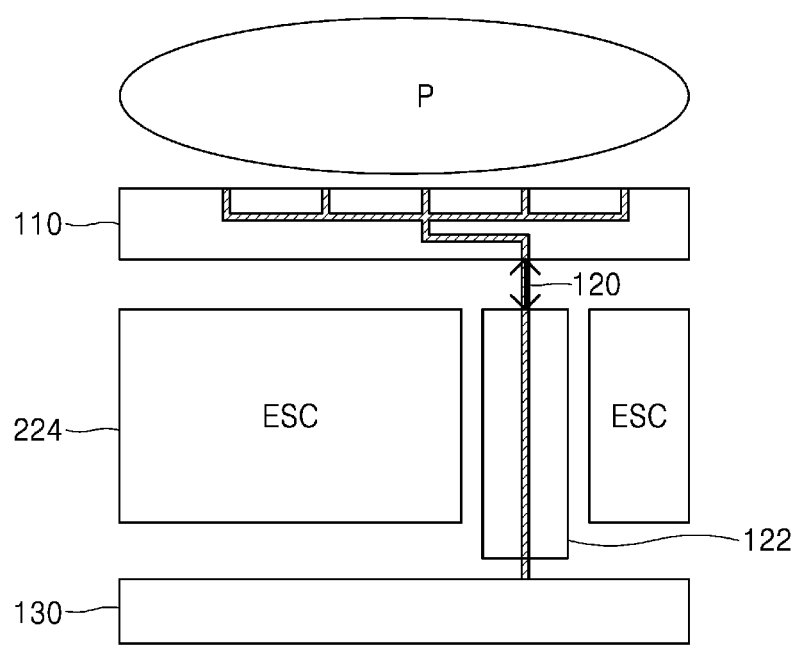
FIG. 2 is a conceptual diagram schematically illustrating a portion of the semiconductor equipment of FIG. 1, the portion corresponding to the semiconductor equipment monitoring apparatus.

FIG. 1 is a conceptual diagram of semiconductor equipment including a semiconductor equipment monitoring apparatus according to an embodiment, and FIG. 2 is a conceptual diagram schematically illustrating a portion of the semiconductor equipment of FIG. 1, the portion corresponding to the semiconductor equipment monitoring apparatus.

Referring to FIGS. 1 and 2, semiconductor equipment 1000 including a semiconductor equipment monitoring apparatus of the embodiment (hereinafter, referred to as 'semiconductor equipment') may include a semiconductor equipment monitoring apparatus 100 and a plasma processing device 200.

As can be seen from FIG. 2, the semiconductor equipment monitoring apparatus 100 may include a wafer-type sensor 110, a light coupling unit 120, and a light detection and analysis unit 130. The wafer-type sensor 110 may be a sensor having a wafer shape, and may be arranged inside a process chamber 220, for example, on an electro-static chuck (ESC) 224, to sense a plasma state in the process chamber 220. The wafer-type sensor 110 will be described in more detail with reference to FIGS. 3 and 4A to 6B.

The light coupling unit 120 may be arranged between the wafer-type sensor 110 and the light detection and analysis unit 130 to transmit light sensed by sensors 103 (refer to FIG. 3) of the wafer-type sensor 110 to the light detection and analysis unit 130. In addition, according to an embodiment, the light coupling unit 120 may transmit light generated by the light detection and analysis unit 130 to the sensors 103 of the wafer-type sensor 110. A lift-pin 122 may be arranged inside the ESC 224, and the light coupling unit 120 may use the lift-pin 122. The light coupling unit 120 will be described in more detail with reference to FIGS. 3, 7A, and 7B.

The light detection and analysis unit 130 may detect and analyze light sensed by the wafer-type sensor 110 and transmitted through the light coupling unit 120. Information on the plasma state in the process chamber 220 may be obtained through an analysis of the detected light by the light detection and analysis unit 130. Here, the plasma state may include, for example, a plasma temperature, a plasma density, distribution and density of plasma by each position, a plasma component distribution, or the like.

According to an embodiment, the light detection and analysis unit 130 may include a light source 132 (refer to FIG. 8) that generates light. When the light detection and analysis unit 130 includes light source 132, the light detection and analysis unit 130 may generate light by the light source 132 and make the generated light incident to the sensors 103 of the wafer-type sensor 110. The light detection and analysis unit 130 will be described in more detail with reference to FIG. 8.

The plasma processing device 200 may include a radio frequency (RF) power source unit 210, the process chamber 220, and a matcher unit 230.

The RF power source unit 210 may include a first RF power source 210-1, a second RF power source 210-2, and a third RF power source 210-3. However, the number of RF power sources included in the RF power source unit 210 is not limited to three. For example, the RF power source unit 210 may include two, or four or more RF power sources.

The first RF power source 210-1 and the second RF power source 210-2 may each apply RF power to the process chamber 220 through a bottom electrode 225 and a first matcher 230-1. In addition, the third RF power source 210-3 may apply RF power to the process chamber 220 through an antenna 228 and a second matcher 230-2. In some embodiments, the second RF power source 210-2 may also apply RF power to the process chamber 220 through the antenna 228 and the second matcher 230-2. In addition, a direct current (DC) power source may be connected to the bottom electrode 225 instead of the second RF power source 210-2 to apply DC power to the process chamber 220.

The first RF power source 210-1, the second RF power source 210-2, and the third RF power source 210-3 may respectively generate RF power of different frequencies. For example, the first RF power source 210-1 may generate first RF power having a first frequency ranging from several MHz to several tens of MHz. The second RF power source 210-2 may generate second RF power having a second frequency ranging from several hundreds of kHz to several MHz. Also, the third RF power source 210-3 may generate third RF power having a third frequency ranging from several MHz to several tens of MHz. In addition, each of the first RF power source 210-1, the second RF power source 210-2, and the third RF power source 210-3 may generate and output RF power of several hundred to several tens of thousands of Watts (W). However, frequency ranges and RF power of the first RF power source 210-1, the second RF power source 210-2, and the third RF power source 210-3 of various embodiments are not limited to the above numerical ranges.

In the plasma processing device 200 of the semiconductor equipment 1000 of the embodiment, the third RF power source 210-3, which is referred to as a plasma power source, may supply the third RF power to generate plasma P in the process chamber 220. In addition, the second RF power source 210-2, which is referred to as a bias power source, may supply bias energy to the plasma P in the process chamber 220 through the second RF power. The role of the first RF power of the first RF power source 210-1 may vary according to various embodiments. For example, the first RF power of the first RF power source 210-1 may assist and increase the third RF power of the third RF power source 210-3 and/or the second RF power of the second RF power source 210-2.

When the plasma P is generated in the process chamber 220, components, such as ions, electrons, and ultraviolet rays, in addition to radicals may also be generated. At least one of these components, such as the radicals, ions, electrons, ultraviolet rays, and the like, may be used in etching, deposition, and cleaning processes. Basically, radicals are electrically neutral, and ions may be electrically polar. Accordingly, when the plasma P is used in an etching process, radicals may be used to isotropically etch an object to be etched, and ions may be used to anisotropically etch the object to be etched.

The process chamber 220 may be a chamber for a plasma process, and the plasma P may be generated therein. In the plasma processing device 200 of the semiconductor equipment 1000 of the embodiment, the process chamber 220 may be an inductively coupled plasma (ICP) chamber. However, according to an embodiment, the process chamber 220 may also be a chamber in which capacitively coupled plasma (CCP) is mixed with ICP.

The process chamber 220 may include a chamber body 222, the ESC 224, a shower head 226, and the antenna 228. The chamber body 222 may define a reaction space in which the plasma P is formed, and may seal the reaction space from the outside. The chamber body 222 may generally include a metal material, and may maintain a ground state to block noise from the outside during a plasma process.

The ESC 224 may be arranged in a lower portion of the inside of the process chamber 220. A substrate to be subjected to a plasma process may be arranged and fixed on an upper surface of the ESC 224. The ESC 224 may fix a substrate by a static electricity force. The substrate may include a semiconductor material, such as a silicon wafer. The ESC 224 may include the bottom electrode 225 for a plasma process therein. The bottom electrode 225 may be connected to the first RF power source 210-1 and the second RF power source 210-2 through the first matcher 230-1.

In the semiconductor equipment 1000 of the embodiment, as shown in FIGS. 1 and 2, the wafer-type sensor 110 may be arranged on the ESC 224. In some embodiments, the wafer-type sensor 110 may be arranged on a substrate. In addition, the wafer-type sensor 110 may include a semiconductor material, such as a silicon wafer. In addition, in the semiconductor equipment 1000 of the embodiment, some components of the light coupling unit 120 for transmitting light to the wafer-type sensor 110 may be arranged inside the ESC 224. The remaining components of the light coupling unit 120 may be arranged in a body 101 (refer to FIG. 3) of the wafer-type sensor 110.

The shower head 226 may be arranged in an upper portion of the inside of the process chamber 220. The shower head 226 may be connected to a process gas source through a gas inlet and a gas supply pipe, and may include a plurality of spray holes therein. The shower head 226 may spray a process gas from the process gas source into the process chamber 220 through the plurality of spray holes. Here, the process gas may include all gases required in a plasma process, such as a source gas, a reaction gas, and a purge gas.

The antenna 228 may be arranged in an upper portion of the process chamber 220 above the shower head 226. In particular, the antenna 228 may be arranged on the shower head 226 and may have a coil shape. Based on the coil shape, the antenna 228 may also be referred to as a coil antenna. The antenna 228 may be connected to the third RF power source 210-3 through the second matcher 230-2. The third RF power of the third RF power source 210-3 may be applied to the process chamber 220 through the antenna 228.

The matcher unit 230 may adjust an impedance so that RF power from the RF power source unit 210 so that a maximum amount of power may be transmitted to the process chamber 220. For example, the matcher unit 230 may maximize the transmission of RF power by adjusting the impedance such that a complex conjugate condition is satisfied based on a maximum power delivery theory. In other words, the matcher unit 230 may drive the RF power source unit 210 in an environment of 50Ω to minimize reflected power, so that a maximum amount of RF power of the RF power source unit 210 may be transmitted to the process chamber 220.

The matcher unit 230 may include the first matcher 230-1 and the second matcher 230-2. The first matcher 230-1 may merge the first RF power of the first RF power source 210-1 with the second RF power of the second RF power source 210-2 to transmit the merged RF power to the bottom electrode 225. In addition, the first matcher 230-1 may adjust the impedance so that a maximum amount of the first RF power and/or the second RF power are transmitted to the process chamber 220. The second matcher 230-2 may transmit the third RF power of the third RF power source 210-3 to the antenna 228, and may also adjust the impedance such that a maximum amount of the third RF power is transmitted to the process chamber 220.

RF power of the RF power source unit 210 may be transmitted to the process chamber 220 through a transmission line 240. The transmission line 240 may be between the matcher unit 230 and the process chamber 220. The transmission line 240 may include, for example, a coaxial (coax) cable, an RF strap, an RF rod, or the like. In general, a coax cable has low attenuation up to high frequencies, so the coax cable is suitable for broadband transmission, and may also have low leakage due to the presence of an external conductor. A coax cable may be mainly used as a transmission cable for transmitting RF power of a high frequency, for example, a frequency ranging from several MHz to several tens of MHz. An RF strap may include a strap conductor, a ground housing, and an insulator. The strap conductor may have a band-like shape extending in one direction, and the ground housing may surround the strap conductor. The ground housing may include a circular tube and there may be an insulator between the strap conductor and the ground housing. In an embodiment, the RF rod may include a cylindrical rod conductor instead of or in addition to a strap conductor. The RF strap or RF rod may also be used to transmit power at high frequencies, for example, a frequency ranging from several MHz to several tens of MHz.

The semiconductor equipment 1000 of the embodiment may include the semiconductor equipment monitoring apparatus 100 having the wafer-type sensor 110. In addition, the semiconductor equipment monitoring apparatus 100 may detect and analyze the state of plasma inside the process chamber 220 by arranging the wafer-type sensor 110 on the ESC 224 inside the process chamber 220. In particular, in an embodiment of the semiconductor equipment monitoring apparatus 100, the wafer-type sensor 110 may sense a plasma state inside the process chamber 220 by using sensors including only passive elements. Accordingly, physical quantities for analyzing a plasma state may be accurately measured without affecting the semiconductor equipment monitoring apparatus 100 and the plasma state inside the process chamber 220. In addition, the semiconductor equipment monitoring apparatus 100 may measure a plasma state in-situ for each internal position of the process chamber 220 based on the structure and characteristics of the wafer-type sensor 110, and may be used without problems in high temperature and RF environments of a plasma process, and gas and power under actual process conditions. Furthermore, the semiconductor equipment monitoring apparatus 100 may monitor a plasma state inside the process chamber 220 in real time and automatically reflect data obtained through the monitoring in a plasma process through feedback, thereby greatly improving the time and reliability of the plasma process.

For reference, in a process of manufacturing a semiconductor, a plasma process may have the greatest influence on the productivity and reliability of semiconductor products, and may be one of the most important factors for improving product yield. As described above, the plasma process may be performed using a process gas, RF power, or the like in the process chamber 220. In such a plasma process, a plasma state in the process chamber 220 may affect the yield. Because a plasma process is performed in a vacuum state in the process chamber 220, it may be difficult to accurately measure physical quantities in the process chamber 220 due to the vacuum, plasma, and electrical problems.

However, the semiconductor equipment monitoring apparatus 100 of the embodiment may accurately measure various physical quantities, such as a temperature, an electric field, infrared radiation (IR), a pressure, an intensity of light, and characteristics of light, in the process chamber 220 in real time by using the wafer-type sensor 110 having a similar shape to a wafer and mounting the wafer-type sensor 110 on the ESC 224 of the process chamber 220. Accordingly, the semiconductor equipment monitoring apparatus 100 of the embodiment may greatly improve the productivity and reliability of products manufactured through a plasma process.

For reference, the plasma processing device 200 of the semiconductor equipment 1000 of the embodiment may be a device for an etching process, which etches a substrate by using plasma. However, embodiments are not limited thereto, and the plasma processing device 200 may be a device for a deposition process, which deposits a material film on a substrate by using plasma, or a device for a cleaning process, which cleans a resultant on a substrate by using plasma after etching or deposition. In addition, the semiconductor equipment 1000 of the embodiment may detect and analyze a plasma state inside the plasma processing device 200, for example, inside the process chamber 220, through the semiconductor equipment monitoring apparatus 100, and may control a plasma process parameter based on an analysis result. Accordingly, the semiconductor equipment 1000 of the embodiment may uniformly and precisely perform a plasma process, for example, etching, deposition, and cleaning processes using plasma, based on the semiconductor equipment monitoring apparatus 100.

In addition, although the plasma processing device 200 is included as a monitoring target in the semiconductor equipment 1000, other semiconductor processing devices may be included as a monitoring target instead of the plasma processing device 200. For example, a semiconductor processing device including a process chamber and in which a substrate is arranged on an ESC, a vacuum chuck, or the like to perform a semiconductor process may also be a monitoring target. Accordingly, the semiconductor equipment monitoring apparatus 100 may be installed in such a semiconductor processing device to configure the semiconductor equipment as in the embodiment.

Figure 3:
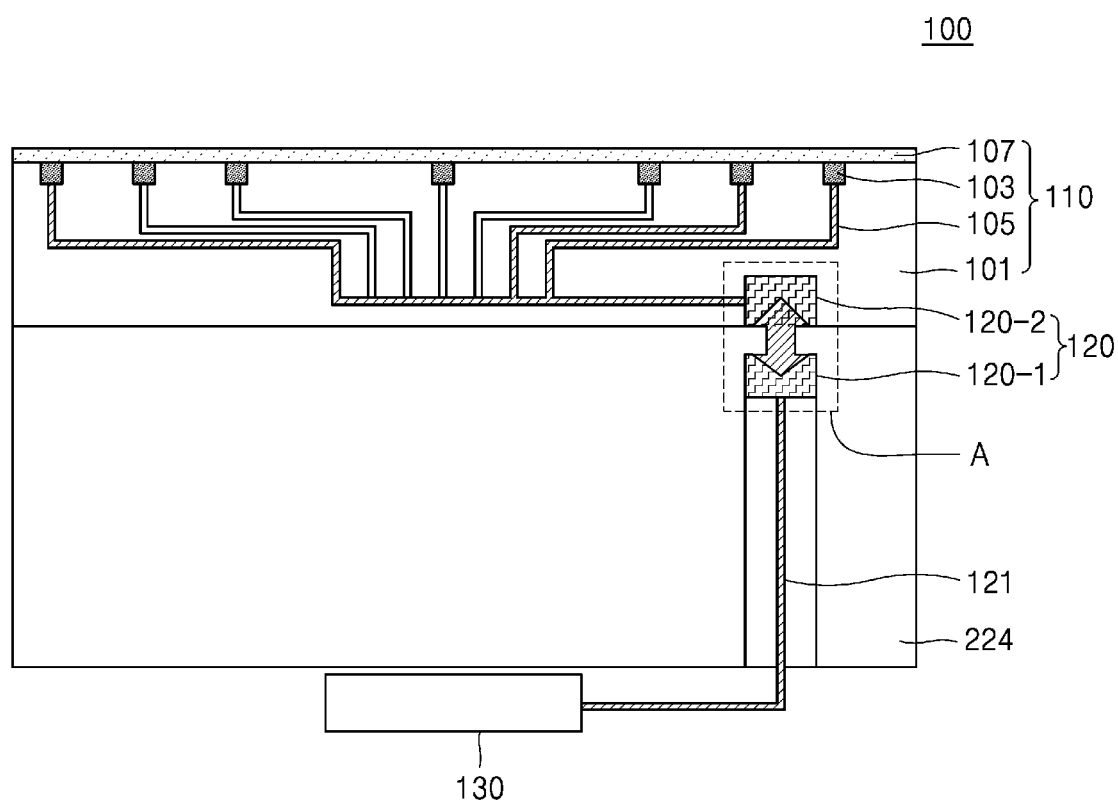
FIG. 3 is a cross-sectional view of a semiconductor equipment monitoring apparatus according to an embodiment.

FIG. 3 is a cross-sectional view of a semiconductor equipment monitoring apparatus according to an embodiment. FIG. 3 is described with reference to FIG. 1 together, and descriptions already given with reference to FIGS. 1 and 2 are briefly made or omitted.

Referring to FIG. 3, the semiconductor equipment monitoring apparatus 100 of the embodiment may include the wafer-type sensor 110, the light coupling unit 120, and the light detection and analysis unit 130.

In the semiconductor equipment monitoring apparatus 100 of the embodiment, the wafer-type sensor 110 may have a wafer shape and may be arranged on the ESC 224 in the process chamber 220. The wafer-type sensor 110 may include the body 101, a sensor 103, a first waveguide 105, and a protective layer 107. The structure of the wafer-type sensor 110 will be described in more detail with reference to FIGS. 4A and 4B. In a semiconductor equipment monitoring apparatus 100*a* (refer to FIG. 6A) of another embodiment, a wafer-type sensor 110*a* (refer to FIG. 6A) may further include a wavelength distribution device 109 (refer to FIG. 6A). A semiconductor equipment monitoring apparatus of another embodiment will be described in more detail with reference to FIGS. 6A and 6B.

The light coupling unit 120 may be between the wafer-type sensor 110 and the light detection and analysis unit 130. The light coupling unit 120 may include a first light transmission device 120-1 arranged inside the ESC 224, and a second light transmission device 120-2 arranged inside the wafer-type sensor 110. Because the wafer-type sensor 110 is arranged on the ESC 224, there may be a free space portion between the first light transmission device 120-1 and the second light transmission device 120-2. Accordingly, the light coupling unit 120 may include the first light transmission device 120-1 and the second light transmission device 120-2 to transmit light in the free space portion.

In the semiconductor equipment monitoring apparatus 100 of the embodiment, the first light transmission device 120-1 of the light coupling unit 120 may be implemented by using a lift-pin. However, the implementation of the first light transmission device 120-1 is not limited to using a lift-pin. For example, the first light transmission device 120-1 may also be implemented by using an RF rod. In addition, the first light transmission device 120-1 may also be implemented through a body of the ESC 224. A light coupling unit 120*a* of the first light transmission device 120-1 implemented by using a lift-pin will be described in more detail with reference to FIG. 7A. In addition, a light coupling unit 120*b* of a first light transmission device 120*a*-1 implemented by using an RF rod will be described in more detail with reference to FIG. 7B.

A portion of a lower portion of the first light transmission device 120-1, in which a waveguide 121 is arranged, may be a portion of a lift-pin. In an embodiment of the first light transmission device 120*a*-1 implemented with an RF rod, a portion of a lower portion of the first light transmission device 120*a*-1, in which the waveguide 121 is arranged, may be a portion of the RF rod. When a first light transmission device is implemented as a body of the ESC 224, a portion of a lower portion of the first light transmission device, in which the waveguide 121 is arranged, may be a portion of the body of the ESC 224.

The light detection and analysis unit 130 may detect and analyze light sensed by the wafer-type sensor 110. The light sensed by the wafer-type sensor 110 may be transmitted to the light detection and analysis unit 130 through the light coupling unit 120. The light detection and analysis unit 130 may include a light detector 134 (refer to FIG. 8) that detects light, and an analyzer 136 (refer to FIG. 8) that analyzes detected light. According to an embodiment, the light detection and analysis unit 130 may include the light source 132 (refer to FIG. 8) that generates light. When the light detection and analysis unit 130 includes the light source 132, the light detection and analysis unit 130 may generate light by the light source 132 and make the generated light be incident to the sensors 103 of the wafer-type sensor 110. The light detection and analysis unit 130 will be described in more detail with reference to FIG. 8.

Figure 4A:
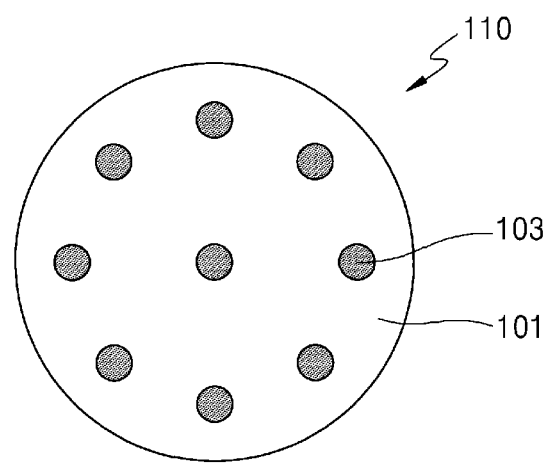
FIGS. 4A and 4B are a plan view and a cross-sectional view of a wafer-type sensor in the semiconductor equipment monitoring apparatus of FIG. 3, respectively.
Figure 4B:
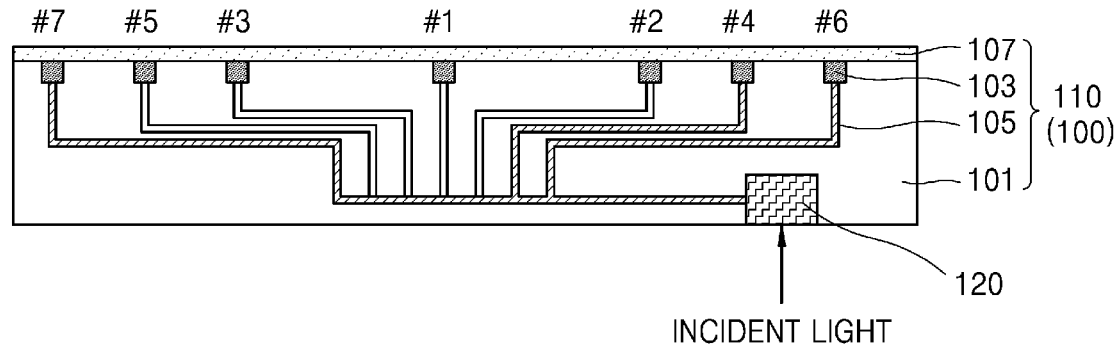

FIGS. 4A and 4B are a plan view and a cross-sectional view of the wafer-type sensor 110 in the semiconductor equipment monitoring apparatus of FIG. 3, respectively.

FIGS. 4A and 4B are described with reference to FIGS. 1 and 3 together, and descriptions already given with reference to FIGS. 1 to 3 are briefly made or omitted.

Referring to FIGS. 4A and 4B, in the semiconductor equipment monitoring apparatus 100 of the embodiment, the wafer-type sensor 110 may include a body 101, a sensor 103, a first waveguide 105, and a protective layer 107.

The body 101 may configure the outer shape of the wafer-type sensor 110, and may have a wafer shape. In addition, the body 101 may include silicon. For example, the body 101 may have substantially the same external shape and material as the external shape and material of a silicon wafer to be subjected to a plasma process. Based on the shape of the body 101, the wafer-type sensor 110 may be arranged and fixed on the ESC 224 in the same manner as a silicon wafer.

The sensor 103 may be arranged at various positions on an upper portion of the body 101. For example, as shown in FIG. 4A, the sensors 103 may be arranged on a central portion and an outer portion of the upper surface of the body 101. In the case of the outer portion of the upper surface of the body 101, the sensors 103 may be spaced apart from each other in the form of a circle. However, the arrangement form of the sensors 103 of FIG. 4A is an example, and the arrangement form of the sensors 103 is not limited thereto. For example, the sensors 103 may have various arrangement forms, and may be arranged on the upper portion of the body 101.

The sensor 103 may sense a physical quantity capable of analyzing a state of plasma in the plasma process. For example, in the semiconductor equipment monitoring apparatus 100 of the embodiment, the sensor 103 may be a sensor capable of sensing at least one of an electric field, a temperature, an electron density, and pressure. However, the type of physical quantity sensed by the sensor 103 is not limited to the physical quantity described above. For example, the sensor 103 may sense another type of physical quantity capable of analyzing a plasma state in the process chamber 220 in a plasma process.

In the semiconductor equipment monitoring apparatus 100 of the embodiment, the sensor 103 may be a sensor using light. For example, the sensor 103 may be a sensor that uses light, such as an optical sensor, an optical temperature sensor, an electro-optic sensor, or the like. For reference, an optical sensor may be a sensor that senses light, an optical temperature sensor may be a sensor that senses temperature and converts the sensed temperature into light, and the electro-optic sensor may be a sensor that senses electrons and converts the sensed electrons into light. However, in the semiconductor equipment monitoring apparatus 100 of the embodiment, the sensor 103 is not limited to a sensor using light. For example, the sensor 103 may also be a sensor using electrons or an electric field. In this case, a line, such as, for example, an electrically conductive line, may be connected to the sensor 103 instead of the first waveguide 105.

In the semiconductor equipment monitoring apparatus 100 of the embodiment, the sensor 103 of the wafer-type sensor 110 may include only passive elements. For example, the sensor 103 may not include an integrated circuit (IC), a battery, or the like. Because the sensor 103 of the embodiment includes only a passive element or elements, the sensor 103 may have no effect on a plasma state in the process chamber 220. That is, an embodiment of the sensor 103 may lack active elements that would interfere with the plasma state or sensing of the plasma state in the process chamber 220 during a plasma process. Accordingly, the sensor 103 may accurately sense a plasma state in the process chamber 220 during a plasma process.

The first waveguide 105 may be arranged inside the body 101, and connect the sensor 103 and the light coupling unit 120 to each other. The first waveguide 105 may be a path through which electromagnetic waves, such as light, travel. Here, the first waveguide 105 may be a concept including an optical fiber. In the semiconductor equipment monitoring apparatus 100 of the embodiment, a plurality of sensors 103 may be arranged in various locations on the upper surface of the body 101. Accordingly, a plurality of first waveguides 105 may be arranged inside the body 101 to respectively correspond to the plurality of sensors 103. That is, one first waveguide 105 may be connected to one sensor 103.

The protective layer 107 may cover and protect the upper surface of the body 101 and the sensor 103. For example, the protective layer 107 may include an insulating material, and may include a material having resistance to plasma, chemical, process gases, or the like. When the sensor 103 senses light generated from plasma, the protective layer 107 may include a transmissive insulating material through which light passes.

In the semiconductor equipment monitoring apparatus 100 of the embodiment, the plurality of first waveguides 105 may all have different lengths from an output end of the light coupling unit 120 to sensors 103 respectively corresponding to the first waveguides 105. In addition, the light detection and analysis unit 130 may include the light source 132 (refer to FIG. 8), and each of the plurality of sensors 103 may include a reflective coating layer that reflects light. As described above, lengths of the plurality of first waveguides 105 of the embodiment are all configured differently, the light detection and analysis unit 130 includes the light source 132, and each of the plurality of sensors 103 includes a reflective coating layer, and thus, the semiconductor equipment monitoring apparatus 100 may detect and analyze plasma states at various positions within the process chamber 220. Hereinafter, descriptions are made in more detail with reference to FIG. 5.

Figure 5:
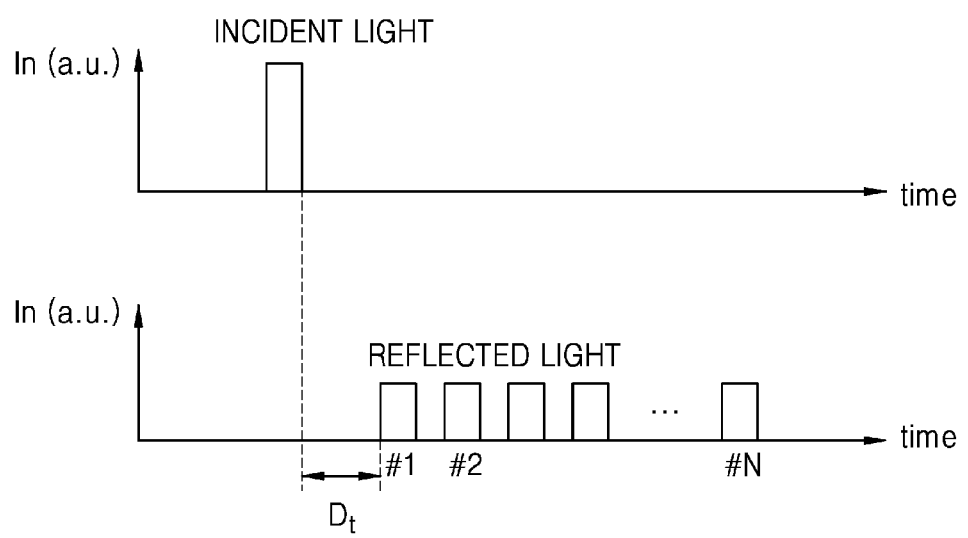
FIG. 5 shows graphs for explaining a principle of detecting a plasma state for each position in a process chamber in the semiconductor equipment monitoring apparatus of FIG. 4A.

FIG. 5 shows graphs for explaining the principle of detecting a plasma state for each position in a process chamber in the semiconductor equipment monitoring apparatus of FIG. 4A, wherein the upper graph is a graph for incident light, and the lower graph is a graph for reflected light. In both graphs, the x-axis is an arbitrary unit of time, and the y-axis is the intensity of light, which is also an arbitrary unit.

Referring to FIG. 5, as described above, in the semiconductor equipment monitoring apparatus 100 of FIG. 4A, the light detection and analysis unit 130 may include the light source 132. In addition, the light source 132 may generate light in pulses, as shown in the upper graph. The plurality of first waveguides 105 of the wafer-type sensor 110 may all have different lengths from an output portion of the light coupling unit 120 to sensors 103 respectively corresponding to the first waveguides 105. Furthermore, each of the plurality of sensors 103 may include a reflective coating layer that reflects light.

For example, in the cross-sectional view of the wafer-type sensor 110 of FIG. 4B, the length of the first waveguide 105 of #1 connected to the sensor 103 arranged at the center of the body 101 may be the shortest, and the length of the first waveguide 105 of #7 connected to the sensor 103 arranged at the outermost left side of the body 101 may be the longest. In addition, lengths of the first waveguides 105 of #1, #2, #3, #4, #5, #6, #7 may gradually increase in order from #1 to #7.

Pulsed light is generated from the light source 132 of the light detection and analysis unit 130 to be incident on sensors 103 through the light coupling unit 120 and the plurality of first waveguides 105. The incident light may be reflected by a reflective coating layer of each of the plurality of sensors 103. In addition, the reflected light may be transmitted through the plurality of first waveguides 105 and the light coupling unit 120 to be detected by the light detector 134 (refer to FIG. 8) of the light detection and analysis unit 130.

Because the lengths of the plurality of first waveguides 105 are all different, light rays detected by the light detector 134 may be detected at different times according to the lengths of the plurality of first waveguides 105. For example, as can be seen from the lower graph, reflected light transmitted through the first waveguide 105 of #1 may be detected first, and reflected light transmitted through the first waveguide 105 of #7 may be detected last. In the lower graph, a section D t indicated by double-headed arrows may mean a delay time until reflected light is detected through the first waveguide 105 of #1 after incident light is incident.

As a result, the reflected light rays detected by time may be matched to the first waveguides 105 and the sensors 103. Accordingly, the states of the plasma at the positions of the corresponding sensors 103 may be detected and analyzed by analyzing the reflected light rays. For reference, when the reflected light rays are from the sensors 103, optical characteristics, for example, wavelengths or polarization, or the like, may be changed in response to a plasma state at the positions of the corresponding sensors 103. Accordingly, the state of the plasma at the position of the corresponding sensor 103 may be obtained by analyzing detected light.

Figure 6A:
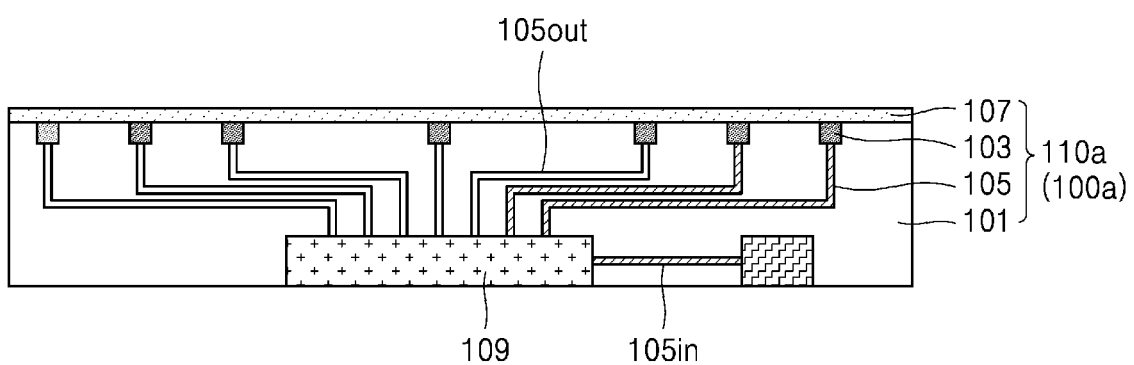
FIG. 6A is a cross-sectional view of a wafer-type sensor in the semiconductor equipment monitoring apparatus of FIG. 3.
Figure 6B:
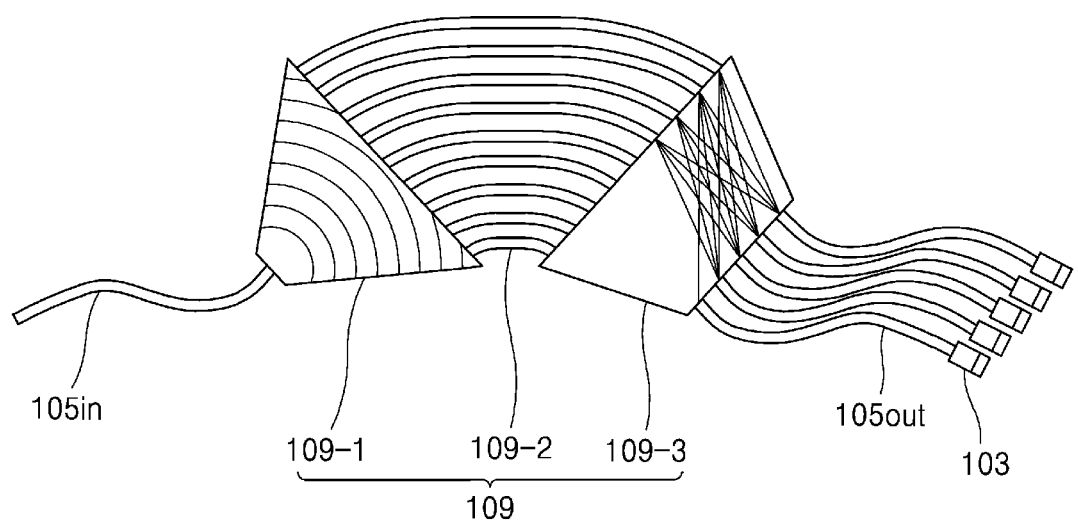
FIG. 6B is a conceptual diagram showing in more detail the configuration of a wavelength distribution device of the wafer-type sensor of FIG. 6A.

FIG. 6A is a cross-sectional view of a wafer-type sensor in the semiconductor equipment monitoring apparatus of FIG. 3, and FIG. 6B is a conceptual diagram showing in more detail the configuration of a wavelength distribution device of the wafer-type sensor of FIG. 6A. Descriptions already given with reference to FIGS. 4A and 4B are briefly made or omitted.

Referring to FIGS. 6A and 6B, the semiconductor equipment monitoring apparatus 100*a* of the embodiment may be different from the semiconductor equipment monitoring apparatus 100 of FIG. 4 in that the wafer-type sensor 110*a* further includes the wavelength distribution device 109. In particular, in the semiconductor equipment monitoring apparatus 100*a* of the embodiment, the wafer-type sensor 110*a* may include the body 101, the sensor 103, the first waveguide 105, the protective layer 107, and the wavelength distribution device 109. The body 101, the sensor 103, the first waveguide 105, and the protective layer 107 are respectively the same as those described with reference to FIGS. 4A and 4B.

As shown in FIG. 6A, the wavelength distribution device 109 may be arranged at a lower side of the inner center of the body 101. However, the position of the wavelength distribution device 109 is not limited thereto. For example, the wavelength distribution device 109 may also be arranged adjacent to the light coupling unit 120. The wavelength distribution device 109 and the light coupling unit 120 may be connected to each other through an input first waveguide 105in.

The wavelength distribution device 109 may be, for example, an arrayed waveguide grating (AWG) device. However, the wavelength distribution device 109 is not limited to an AWG device. For example, other spectroscopic devices capable of separating light by wavelength may be used as the wavelength distribution device 109.

As can be seen through FIG. 6B, the wavelength distribution device 109 may include a free space area 109-1, a second waveguide 109-2, and an output area 109-3. The free space area 109-1 may mean a vacuum area in which there is no material. The free space area 109-1 may be connected to the input first waveguide 105in. Light input from the input first waveguide 105in may spread in the free space area 109-1 in the form of concentric circles.

The second waveguide 109-2 may connect the free space area 109-1 and the output area 109-3 to each other, and may transmit light from the free space area 109-1 to the output area 109-3. The second waveguide 109-2 may be substantially the same as the first waveguide 105 except that the second waveguide 109-2 is arranged in the wavelength distribution device 109.

The output area 109-3 may split light from the second waveguide 109-2 into light for each wavelength through constructive interference and supply the split light to output first waveguides 105out. In particular, in the output area 109-3, a grating may be formed on an incident surface side, and light incident from the second waveguide 109-2 may be refracted at different angles for each wavelength through the grating. In addition, light rays incident from different second waveguides 109-2 may destructively interfere with each other or constructively interfere with each other. Light due to constructive interference may be incident to the output first waveguide 105out. In addition, light due to constructive interference may be incident to the output first waveguide 105out at a position corresponding to each wavelength.

In the semiconductor equipment monitoring apparatus 100*a* of the embodiment, the wafer-type sensor 110*a* may include the wavelength distribution device 109. Also, the light detection and analysis unit 130 may include the light source 132. Furthermore, each of the plurality of sensors 103 may include a reflective coating layer that reflects light. As described above, the wafer-type sensor 110*a* includes the wavelength distribution device 109, the light detection and analysis unit 130 includes the light source 132, and each of the plurality of sensors 103 includes a reflective coating layer, and thus, plasma states at various positions of the process chamber 220 may be detected and analyzed. That is, light is incident to the sensor 103 at a corresponding position for each wavelength through the wavelength distribution device 109 and reflected light is detected and analyzed, so that information on a plasma state where the corresponding sensor 103 is positioned may be obtained. The light source 132 of the light detection and analysis unit 130 may generate, for example, a multi-wavelength or short-wavelength laser. The light source 132 of an embodiment may include a laser diode, a light emitting diode (LED) or another light source that may generate a light, such as a pulsed light.

Figure 7A:
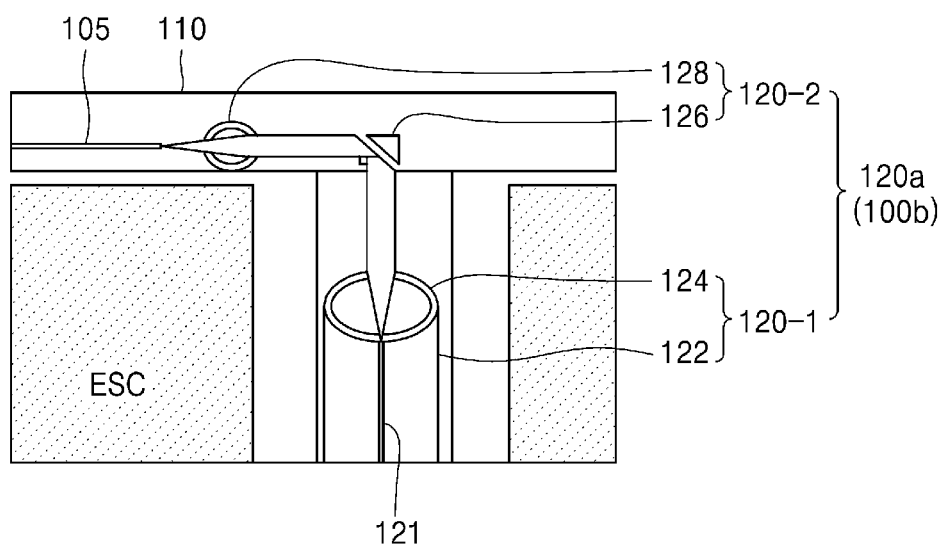
FIGS. 7A and 7B are conceptual views each illustrating in more detail the configuration of a light coupling unit in the semiconductor equipment monitoring apparatus of FIG. 3.
Figure 7B:
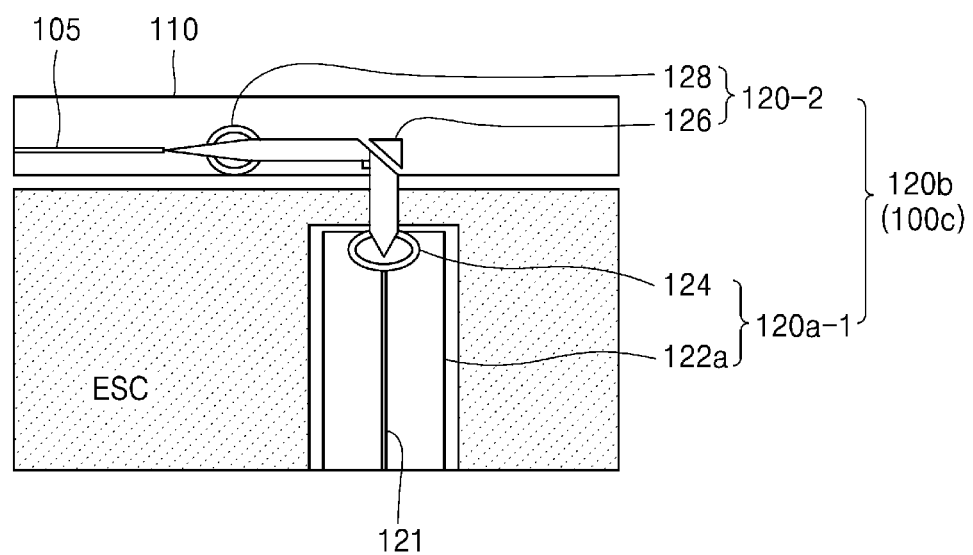

FIGS. 7A and 7B are conceptual views illustrating in more detail the configuration of a light coupling unit in the semiconductor equipment monitoring apparatus of FIG. 3, corresponding to enlarged cross-sectional views of portion A of FIG. 3. FIGS. 7A and 7B are described with reference to FIGS. 1 and 3 together, and descriptions already given with reference to FIGS. 1 to 6 are briefly made or omitted.

Referring to FIG. 7A, in a semiconductor equipment monitoring apparatus 100*b* of the embodiment, the light coupling unit 120*a* may include a lift-pin 122 arranged in the ESC 224. In particular, the semiconductor equipment monitoring apparatus 100*b* may include the wafer-type sensor 110, the light coupling unit 120*a*, and the light detection and analysis unit 130. The wafer-type sensor 110 and the light detection and analysis unit 130 are the same as those described with reference to FIGS. 4A and 4B. The semiconductor equipment monitoring apparatus 100b of the embodiment may also include the wafer-type sensor 110a of FIG. 6A instead of the wafer-type sensor 110 of FIG. 4B.

The light coupling unit 120a may include the first light transmission device 120-1 arranged inside the ESC 224, and the second light transmission device 120-2 arranged in the wafer-type sensor 110. In addition, the first light transmission device 120-1 may include the lift-pin 122 and a first lens 124. As shown in FIG. 7A, a third waveguide 121 may be formed inside the lift-pin 122. For reference, the lift-pin 122 is also referred to as a wafer lift-pin, and may refer to a pin used to push up a wafer when the wafer is separated from the ESC 224.

The first lens 124 may be arranged on the upper portion of the lift-pin 122, and may emit light from the third waveguide 121 into a free space. The light emitted from the first lens 124 may travel in the form of a parallel beam in the free space. The first lens 124 may be, for example, a collimation lens. However, the first lens 124 is not limited to a collimation lens.

The second light transmission device 120-2 may include a mirror 126 and a second lens 128. The mirror 126 may reflect light emitted from the first lens 124 and direct the reflected light to the second lens 128. That is, the mirror 126 may change the path of light emitted by the first lens 124. Light from the mirror 126 to the second lens 128 may travel to the free space in the form of a parallel beam. The second lens 128 may focus a beam to be incident on the first waveguide 105. For example, the second lens 128 may be a focusing lens.

For reference, because the wafer-type sensor 110 is arranged on the upper surface of the ESC 224, there may be a gap may physically between the wafer-type sensor 110 and the ESC 224. The gap may be, for example, a gap of about 1 mm. Accordingly, incident light or emitted light passes through such a gap, and the light coupling unit 120a is positioned at least partially in the gap. For example, the gap between the wafer-type sensor 110 and the ESC 224 may be included in a free space between the mirror 126 and the first lens 124.

Referring to FIG. 7B, in a semiconductor equipment monitoring apparatus 100c of the embodiment, the light coupling unit 120b may be implemented by using an RF rod 122a arranged in the ESC 224. In particular, the semiconductor equipment monitoring apparatus 100c may include the wafer-type sensor 110, the light coupling unit 120b, and the light detection and analysis unit 130. The wafer-type sensor 110 and the light detection and analysis unit 130 are the same as those described with reference to FIGS. 4A and 4B. The semiconductor equipment monitoring apparatus 100c of the embodiment may also include the wafer-type sensor 110a of FIG. 6A instead of the wafer-type sensor 110 of FIG. 4B.

The light coupling unit 120b may include a first light transmission device 120a-1 arranged inside the ESC 224, and a second light transmission device 120-2 arranged in the wafer-type sensor 110. The second light transmission device 120-2 may be substantially the same as the second light transmission device 120-2 of the light coupling unit 120a of the semiconductor equipment monitoring apparatus 100b of FIG. 7A. Accordingly, a detailed description of the second light transmission device 120-2 is omitted.

The first light transmission device 120a-1 may include the RF rod 122a and the first lens 124. As shown in FIG. 7B, the third waveguide 121 may be formed inside the RF rod 122a. For reference, the RF rod 122a may include a transmission line that transmits RF power of the RF power source unit 210 to the process chamber 220. The first lens 124 may be substantially the same as the first lens 124 of the first light transmission device 120-1 of the light coupling unit 120a of FIG. 7A except that the first lens 124 is arranged on the upper portion of the RF rod 122a instead of the lift-pin 122.

In the semiconductor equipment monitoring apparatus 100c of the embodiment, the light coupling unit 120b may have the following differences from the light coupling unit 120a of FIG. 7A in addition to using the RF rod 122a instead of the lift-pin 122 described above. In the light coupling unit 120a of FIG. 7A, because the lift-pin 122 has to rise above the upper surface of the ESC 224 for a function thereof, a portion of the ESC 224 on the lift-pin 122 may have an open shape. Accordingly, light emitted by the first lens 124 directly travels to a free space.

In the light coupling unit 120b of the embodiment, the RF rod 122a is arranged inside the ESC 224, and a portion of the ESC 224 on the RF rod 122a is not open and instead covers the RF rod 122a. Accordingly, a portion of the ESC 224 on the RF rod 122a may include a transparent material, and light emitted from the first lens 124 may pass through the transparent portion of the ESC 224 and then travel to a free space. Thereafter, the light being reflected by the mirror 126 and incident to the first waveguide 105 through the second lens 128 may be the same in both the light coupling units 120a and 120b of FIGS. 7A and 7B.

Figure 8:
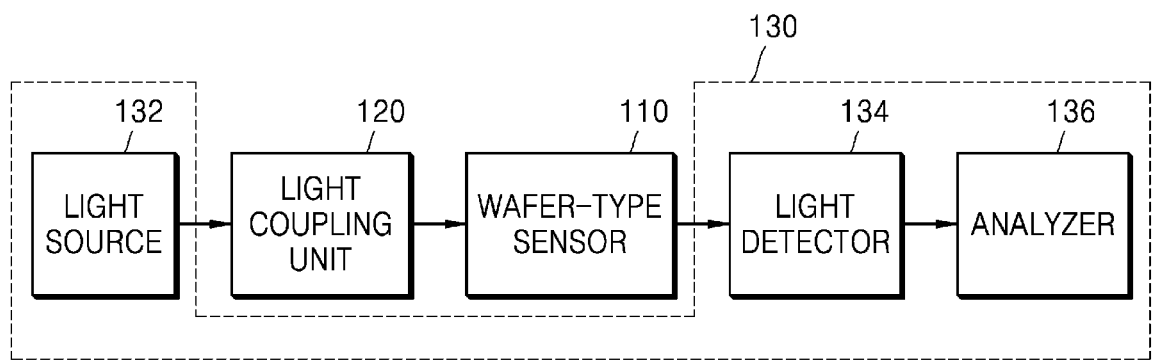
FIG. 8 is a block structural diagram of the semiconductor equipment monitoring apparatus of FIG. 3, illustrating in more detail a light detection and analysis unit.

FIG. 8 is a block structural diagram of the semiconductor equipment monitoring apparatus of FIG. 3, illustrating in more detail a light detection and analysis unit. FIG. 8 is described with reference to FIGS. 1 and 3 together, and descriptions already given with reference to FIGS. 1 to 7B are briefly made or omitted.

Referring to FIG. 8, the semiconductor equipment monitoring apparatus 100 in the embodiment may include the wafer-type sensor 110, the light coupling unit 120, and the light detection and analysis unit 130. The wafer-type sensor 110 and the light coupling unit 120 are the same as those described with reference to FIGS. 4A to 7B.

The light detection and analysis unit 130 may include the light source 132, the light detector 134, and the analyzer 136. The light source 132 may generate light to be incident to the light coupling unit 120. For example, the light source 132 may generate light suitable for analyzing a state of plasma inside the process chamber 220. The light source 132 may generate, for example, multi-wavelength or short-wavelength laser light. The light generated by the light source 132 may have a wavelength range in which a wavelength or polarization may be changed according to a state of plasma inside the process chamber 220. Light from the light source 132 may be incident to the light coupling unit 120 through a waveguide. Here, the waveguide may include an external waveguide from the light source 132 to the third waveguide 121 of the light coupling unit 120 and the third waveguide 121.

According to an embodiment, the light source 132 may be omitted. For example, the semiconductor equipment monitoring apparatus 100 may sense light or electromagnetic waves or the like generated in plasma through the sensors 103 of the wafer-type sensor 110 without generating light and inputting the generated light to the sensor 103. In this case, each of the sensors 103 of the wafer-type sensor 110 may not include a reflective coating layer.

The light detector 134 may detect light sensed by the sensor 103 and transmitted through the light coupling unit 120. The light detector 134 may be, for example, a charge-coupled device (CCD) camera or a complementary metal oxide semiconductor (CMOS) camera. However, the light detector 134 is not limited to a CCD camera or a CMOS camera. An embodiment of a light detector 134 may include a photo-diode.

The analyzer 136 may analyze light detected by the light detector 134. Information on a plasma state in the process chamber 220 may be obtained through an analysis of light by the analyzer 136. The analyzer 136 may be or include a processor which may be included in a personal computer (PC) or a workstation including a corresponding analysis program or other algorithm. The analyzer 136 may also be implemented as a special purpose computer including at least one processor configured to control the above-described functions based on computer programs stored in a memory or memory module. For example, the processor may be a central processing unit (CPU), an application processor, a modem-integrated application processor, a system-on-chip (SoC), an integrated circuit, or the like.

The semiconductor equipment monitoring apparatus 100 of the embodiment may measure a plasma state according to a position inside the process chamber 220 by using the sensors 103 arranged at various positions in the wafer-type sensor 110. In addition, the semiconductor equipment monitoring apparatus 100 of the embodiment may monitor a plasma state inside the process chamber 220 in-situ through the wafer-type sensor 110, and may provide the measured plasma state as feedback to adjust plasma process parameters in real time, thereby improving the efficiency and reliability of a plasma process.

While has aspects of embodiments have been particularly shown and described with reference to embodiments thereof, it will be understood that various changes in form and details may be made therein without departing from the spirit and scope of the following claims.

What is claimed is:

1. A semiconductor equipment monitoring apparatus comprising:
   a wafer-type sensor inside a process chamber and configured to sense a plasma state inside the process chamber;
   a light detector and analyzer configured to detect and analyze a light sensed by the wafer-type sensor; and
   a light coupler, between the wafer-type sensor and the light detector and analyzer, configured to transmit the light sensed by the wafer-type sensor to the light detector and analyzer,
   wherein the wafer-type sensor comprises a plurality of sensors each comprising a passive element,
   wherein the wafer-type sensor comprises:
      a body having a wafer shape;
      the plurality of sensors at different positions on an upper surface of the body;
      a plurality of first waveguides inside the body and configured to connect the plurality of sensors and the light coupler to each other; and
      a protective layer configured to cover the upper surface of the body and the plurality of sensors, and
   wherein the wafer-type sensor further comprises a wavelength distribution device configured to split light from the light coupler for each wavelength and supply the split light to the plurality of first waveguides.

2. The semiconductor equipment monitoring apparatus of claim 1, wherein the wavelength distribution device comprises an arrayed waveguide grating (AWG) device,
   wherein the wavelength distribution device comprises a free space area to which light from the light coupler is incident, an output area, and a plurality of second waveguides having different lengths and configured to transmit light from the free space area to the output area, and
   wherein the output area is configured to split light from the plurality of second waveguides into light for each wavelength through constructive interference, and supply the split light to the plurality of first waveguides.

3. The semiconductor equipment monitoring apparatus of claim 1, wherein lengths of the plurality of first waveguides from an output position of the light coupler to the plurality of sensors are all different.

4. The semiconductor equipment monitoring apparatus of claim 1, wherein the light coupler comprises a first light transmission device in an electro-stack chuck (ESC) of the process chamber, and a second light transmission device in the body of the wafer-type sensor, and
   wherein the light detector and analyzer comprises a light detector configured to detect the light sensed by the wafer-type sensor, and an analyzer configured to signal-process and analyze the light sensed by the wafer-type sensor.

5. The semiconductor equipment monitoring apparatus of claim 4, wherein the first light transmission device comprises a lift-pin or radio frequency (RF) rod disposed in the electro-stack chuck (ESC) and having a waveguide disposed therein, and a first lens on an upper portion of the lift-pin or radio frequency (RF) rod, and
   wherein the second light transmission device comprises a mirror configured to reflect light from the first light transmission device, and a second lens configured to make light from the mirror be incident to a waveguide in the body.

6. The semiconductor equipment monitoring apparatus of claim 4, wherein the light detector and analyzer further comprises a light source configured to generate light, and
   wherein each of the plurality of sensors comprises a reflective coating layer configured to reflect light from the light source.

7. The semiconductor equipment monitoring apparatus of claim 1, wherein the light detector and analyzer is further configured to analyze a plasma state for each position in the process chamber according to an analysis based on at least one of a wavelength and a time, and
   wherein, when the analysis is based on the time, the analysis comprises generating a pulsed light to be incident to the wafer-type sensor.

8. The semiconductor equipment monitoring apparatus of claim 1, wherein the wafer-type sensor is further configured to sense the plasma state by sensing at least one of a temperature, an electric field, an electron density, and a pressure in the process chamber during a semiconductor operation.

9. A semiconductor equipment monitoring apparatus comprising:
   a wafer-type sensor comprising a body having a wafer shape, and comprising a plurality of sensors at different positions on an upper surface of the body, and a plurality of waveguides inside the body and respectively connected to the plurality of sensors; and
   a light coupler between the wafer-type sensor and a light detector, the light coupler comprising a first light transmission device in an electro-static chuck (ESC) of a process chamber, and a second light transmission device inside the body of the wafer-type sensor,
   wherein each of the plurality of sensors comprises a passive element, and wherein the wafer-type sensor is inside the process chamber and configured to sense a plasma state inside the process chamber.

10. The semiconductor equipment monitoring apparatus of claim 9, wherein the wafer-type sensor further comprises a wavelength distribution device configured to split light from the light coupler by each wavelength into a split light and supply the split light to the plurality of waveguides.

11. The semiconductor equipment monitoring apparatus of claim 9, wherein the first light transmission device comprises a lift-pin or radio frequency (RF) rod disposed in the ESC and having a waveguide disposed therein, and a first lens on an upper portion of the lift-pin or radio frequency (RF) rod, and the second light transmission device comprises a mirror configured to reflect light from the first light transmission device, and a second lens configured to make light from the mirror be incident to a waveguide in the body.

12. The semiconductor equipment monitoring apparatus of claim 9, further comprising a light source configured to generate light for input to the wafer-type sensor, wherein each of the plurality of sensors comprises a reflective coating layer configured to reflect light from the light source.

13. The semiconductor equipment monitoring apparatus of claim 9, wherein the semiconductor equipment monitoring apparatus is configured to analyze a plasma state for each position in the process chamber according to an analysis based on at least one of a wavelength and a time of light detected by the light detector, and wherein, when the analysis is based on at least the time of light detected by the light detector, the analysis comprises generating a pulsed light to be incident to the wafer-type sensor.

14. A semiconductor equipment comprising:

a process chamber configured to perform a semiconductor operation using plasma; and a semiconductor equipment monitoring apparatus comprising components inside the process chamber and configured to monitor a plasma state of the inside of the process chamber, wherein the semiconductor equipment monitoring apparatus comprises:

a wafer-type sensor inside the process chamber and configured to sense a plasma state inside the process chamber;

a light detector and analyzer configured to detect and analyze light sensed by the wafer-type sensor; and a light coupler between the wafer-type sensor and the light detector and analyzer and configured to transmit the light sensed by the wafer-type sensor to the light detector and analyzer, wherein the wafer-type sensor comprises a plurality of sensors each comprising a passive element, wherein the light coupler comprises a first light transmission device in an electro-static chuck (ESC) of the process chamber, and a second light transmission device inside a body of the wafer-type sensor, wherein the first light transmission device comprises a lift-pin or radio frequency (RF) rod in the ESC and having a waveguide disposed therein, and a first lens on an upper portion of the lift-pin or radio frequency (RF) rod, and wherein the second light transmission device comprises a mirror configured to reflect light from the first light transmission device, and a second lens configured to make light from the mirror be incident to a waveguide in the body.

15. The semiconductor equipment of claim 14, wherein the body has a wafer shape, and wherein the wafer-type sensor further comprises:

the plurality of sensors at different positions on an upper surface of the body; and a plurality of waveguides inside the body and configured to connect the plurality of sensors and the light coupler to each other.

16. The semiconductor equipment of claim 15, wherein the wafer-type sensor further comprises a wavelength distribution device configured to split light from the light coupler by each wavelength and supply the split light to the plurality of waveguides.

17. The semiconductor equipment of claim 14, wherein the light detector and analyzer is further configured to analyze a plasma state for each position in the process chamber by performing an analysis based on at least one of a wavelength and a time.

* * * * *